United States Patent
Lin et al.

(10) Patent No.: US 11,735,401 B2
(45) Date of Patent: *Aug. 22, 2023

(54) IN-SITU OPTICAL CHAMBER SURFACE AND PROCESS SENSOR

(71) Applicant: Applied Materials, Inc., Santa Clara, CA (US)

(72) Inventors: Chuang-Chia Lin, San Ramon, CA (US); Upendra Ummethala, Cupertino, CA (US); Steven E. Babayan, Los Altos, CA (US); Lei Lian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/466,912

(22) Filed: Sep. 3, 2021

(65) Prior Publication Data

US 2021/0398785 A1 Dec. 23, 2021

Related U.S. Application Data

(63) Continuation of application No. 16/378,271, filed on Apr. 8, 2019, now Pat. No. 11,114,286.

(51) Int. Cl.
*G01J 3/443* (2006.01)
*G01J 3/02* (2006.01)
(Continued)

(52) U.S. Cl.
CPC ....... *H01J 37/32917* (2013.01); *G01J 3/0218* (2013.01); *G01J 3/443* (2013.01); *H01J 37/22* (2013.01); *H01J 2237/24585* (2013.01)

(58) Field of Classification Search
CPC ...................................................... G01J 3/443
See application file for complete search history.

(56) References Cited

U.S. PATENT DOCUMENTS

| 3,594,658 A | 7/1971 | Cason et al. |
| 4,549,080 A | 10/1985 | Baskins et al. |

(Continued)

FOREIGN PATENT DOCUMENTS

| CN | 106796143 A | 5/2017 |
| CN | 108109938 A | 6/2018 |

(Continued)

OTHER PUBLICATIONS

International Search Report and Written Opinion from PCT/US2020/026476 dated Jul. 23, 2020, 12 pgs.

(Continued)

*Primary Examiner* — Hina F Ayub
(74) *Attorney, Agent, or Firm* — Schwabe, Williamson & Wyatt, P.C.

(57) ABSTRACT

Embodiments disclosed herein include optical sensor systems and methods of using such systems. In an embodiment, the optical sensor system comprises a housing and an optical path through the housing. In an embodiment, the optical path comprises a first end and a second end. In an embodiment a reflector is at the first end of the optical path, and a lens is between the reflector and the second end of the optical path. In an embodiment, the optical sensor further comprises an opening through the housing between the lens and the reflector.

14 Claims, 7 Drawing Sheets

(51) Int. Cl.
*H01J 37/32* (2006.01)
*H01J 37/22* (2006.01)

(56) References Cited

U.S. PATENT DOCUMENTS

| | | | |
|---|---|---|---|
| 5,347,460 | A | 9/1994 | Gifford et al. |
| 5,985,032 | A | 11/1999 | Koji |
| 6,134,005 | A | 10/2000 | Smith, Jr. et al. |
| 9,970,818 | B2 | 5/2018 | Bao et al. |
| 10,134,569 | B1 | 11/2018 | Albarede et al. |
| 10,319,649 | B2 | 6/2019 | Cho et al. |
| 2004/0237888 | A1 | 12/2004 | Codella et al. |
| 2005/0134834 | A1 | 6/2005 | Davis et al. |
| 2005/0199603 | A1 | 9/2005 | Vardelle et al. |
| 2008/0074658 | A1 | 3/2008 | Davis et al. |
| 2008/0078504 | A1 | 4/2008 | Vukovic |
| 2008/0278721 | A1 | 11/2008 | Bai et al. |
| 2009/0103081 | A1* | 4/2009 | Whelan ............ G01J 3/28 356/243.1 |
| 2010/0110423 | A1 | 5/2010 | Villaumie |
| 2013/0031957 | A1 | 2/2013 | Shaw et al. |
| 2015/0126874 | A1 | 5/2015 | Lee et al. |
| 2015/0131698 | A1 | 5/2015 | Vellore et al. |
| 2017/0067779 | A1 | 3/2017 | Kim et al. |
| 2017/0153214 | A1 | 6/2017 | Wang et al. |
| 2017/0322133 | A1 | 11/2017 | Trainer |
| 2017/0322149 | A1 | 11/2017 | Pape et al. |
| 2018/0012737 | A1 | 1/2018 | Moon et al. |
| 2019/0051502 | A1* | 2/2019 | Asakura ............ H01J 37/32926 |
| 2019/0101375 | A1 | 4/2019 | Morino et al. |

FOREIGN PATENT DOCUMENTS

| | | |
|---|---|---|
| EP | 0814333 A2 | 12/1997 |
| EP | 2669651 A2 | 12/2013 |
| JP | 2005228727 A | 8/2005 |
| JP | 2010262887 A | 11/2010 |
| JP | 2016119473 A | 6/2016 |
| JP | 2018/026558 | 2/2018 |
| KR | 10-2006-0002177 | 1/2006 |
| KR | 1020090125490 A | 12/2009 |
| KR | 10-2012-0039253 | 4/2012 |
| KR | 1020140097746 A | 8/2014 |
| KR | 101453819 B1 | 10/2014 |
| KR | 102025873 | 9/2019 |
| TW | 201820937 A | 6/2018 |
| TW | 201941252 A | 10/2019 |

OTHER PUBLICATIONS

Non-Final Office Action from U.S. Appl. No. 16/378,271 dated Jul. 30, 2020, 18 pgs.
International Search Report and Written Opinion of the International Searching Authority for PCT/US2020/054970 dated Jan. 29, 2021, 10 pgs.
Non-Final Office Action from U.S. Appl. No. 16/378,271 dated Feb. 16, 2021, 12 pgs.
Final Office Action from U.S. Appl. No. 16/378,271 dated Apr. 6, 2021, 15 pgs.
Extended European Search Report for Patent Application No. 20787662.4 dated Dec. 2, 2022, 11 pgs.
International Preliminary Report on Patentability from PCT Application No. PCT/US2020/026476, dated Sep. 28, 2021, 7 pgs.
Non-Final Office Action from U.S. Appl. No. 16/682,616 dated May 16, 2022, 23 pgs.
Notice of Reasons for Rejection from Japanese Patent Application No. 2021-559365 dated Dec. 19, 2022, 6 pgs.
Official Letter from Taiwan Patent Application No. 109111753 dated Dec. 5, 2022, 12 pgs.
Official letter from Taiwan Patent Application No. 109111753 dated Apr. 17, 2023, 4 pgs.
Official letter from Taiwan Patent Application No. 109139300 dated Jun. 5, 2023, 14 pgs.
First Office Action from Chinese Patent Application No. 202080027448.6 dated Jun. 20, 2023, 13 pgs.

* cited by examiner

IN-SITU OPTICAL CHAMBER SURFACE AND PROCESS SENSOR

CROSS-REFERENCE TO RELATED APPLICATIONS

This application is a continuation of U.S. patent application Ser. No. 16/378,271, filed on Apr. 8, 2019, the entire contents of which are hereby incorporated by reference herein.

BACKGROUND

1) Field

Embodiments relate to the field of semiconductor manufacturing and, in particular, to systems and methods for providing in-situ optical sensors for monitoring chamber surface conditions and chamber processing parameters.

2) Description of Related Art

Changes to the surfaces of a chamber impacts various processing parameters. For example, redeposition of etching byproducts on the chamber wall may alter the etching rate of a given process. Accordingly, as substrates are processed in the chamber, the etching rate (or other process parameters) may change and result in non-uniform processing between substrates.

In an attempt to account for changes to processing conditions, optical emission spectroscopy (OES) has been implemented in processing chambers. OES involves monitoring the emission spectrum of a plasma in the chamber. A window is positioned along the chamber wall and the emission spectrum may pass along an optical path through the window to a sensor outside of the chamber. As the spectrum of a plasma changes, qualitative analysis of the processing operation may be inferred. Particularly, OES is useful for determining when an end-point of the processing operation has been met. In order to provide the best measurements, the window is designed to prevent deposition from occurring along the light path. Furthermore, while end-point analysis is possible, there is currently no process for implementing quantitative analysis using existing OES systems.

SUMMARY

Embodiments disclosed herein include optical sensor systems and methods of using such systems. In an embodiment, the optical sensor system comprises a housing and an optical path through the housing. In an embodiment, the optical path comprises a first end and a second end. In an embodiment a reflector is at the first end of the optical path, and a lens is between the reflector and the second end of the optical path. In an embodiment, the optical sensor further comprises an opening through the housing between the lens and the reflector.

In an embodiment, a method for measuring a process condition or a chamber condition in a processing chamber with an optical sensor comprises obtaining a reference signal. In an embodiment, obtaining the reference signal comprises emitting electromagnetic radiation from a source outside of the chamber, where the electromagnetic radiation is propagated along an optical path between the source and a reflector in the chamber, reflecting the electromagnetic radiation back along the optical path with the reflector, and sensing the reflected electromagnetic radiation with a sensor that is optically coupled to the optical path. In an embodiment, the method further comprises obtaining a process signal, where obtaining the process signal comprises, sensing electromagnetic radiation emitted in the processing chamber that travels along the optical path with the sensor. In an embodiment, the method further comprises comparing the process signal with the reference signal.

In an embodiment, an optical sensing array for a plasma processing chamber, comprises a plurality of optical sensing systems oriented around a perimeter of the processing chamber. In an embodiment, each of the plurality of optical sensing systems comprise a housing, an optical path through the housing, where the optical path comprises a first end and a second end, a reflector at the first end of the optical path, a lens between the reflector and the second end of the optical path, and an opening through the housing between the lens and the reflector.

DETAILED DESCRIPTION

Figure 1:
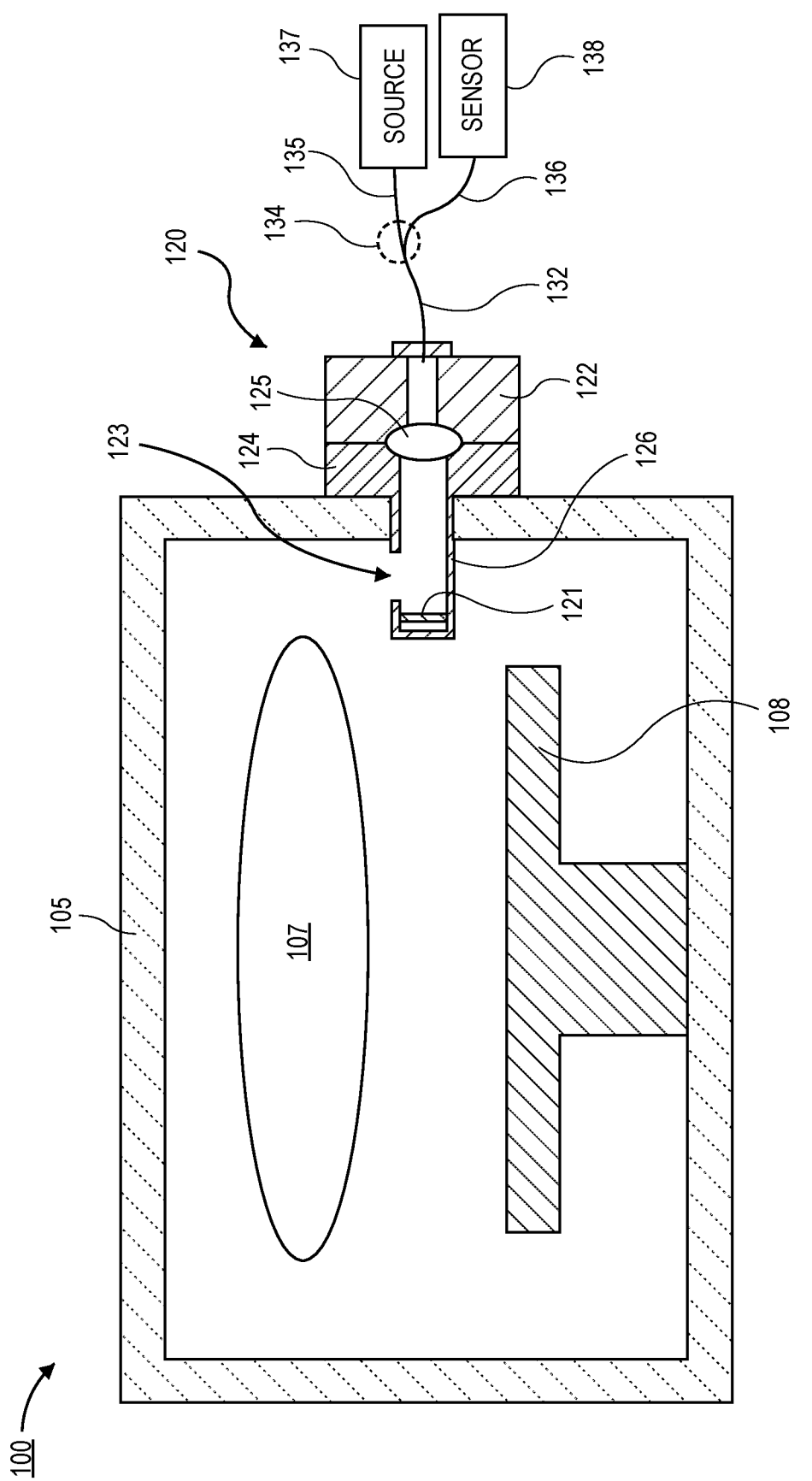
FIG. 1 is a cross-sectional illustration of a chamber with an optical sensor that passes through a wall of the chamber, in accordance with an embodiment.

Systems and methods described herein include optical sensors for in-situ monitoring of a chamber condition and/or processing conditions in the chamber. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, currently available optical emission spectroscopy (OES) systems can provide qualitative measurements to achieve functions such as end-point determinations, but cannot currently provide precise quantitative measurements. Processing parameters, such as etch rate, cannot be directly measured with existing OES systems. Accordingly, embodiments disclosed herein include an optical sensor system that includes an optical path over which a reference signal and the plasma emission spectrum both pass. For example, the optical path begins at a light source, passes through the chamber wall, and reflects off of a reflector surface in the chamber back towards a sensor along the optical path. Since the reference signal and the emission spectrum pass along the same optical path, the reference signal can be used to determine the losses attributable to the optical path without opening the chamber and disrupt the operation. This allows for an accurate and quantitative measurement of the emission spectrum. Accordingly, the calibrated plasma emission spectrum can be used to determine processing parameters, such as etch rate.

Furthermore, whereas currently available OES systems are designed to prevent deposition along the optical path, embodiments disclosed herein include a reflector surface that is exposed to the processing environment. In some embodiments, the reflector surface may be chosen to substantially match the interior surfaces of the chamber. As such, deposition on the reflector surface is substantially similar to the deposition seen on the interior surface of the chamber. The reflector surface interacts with the electromagnetic radiation emitted by the source, and therefore, can be used to determine characteristics of the deposited film or wall materials conversion. For example, absorption of portions of the spectrum of the electromagnetic radiation may be correlated to a particular material composition and/or thickness of the film.

Accordingly, embodiments disclosed herein allow for quantitative in-situ measurement of processing conditions and/or chamber conditions. Since quantitative measurements are provided by embodiments disclosed herein, embodiments may allow for chamber matching measurements (i.e., comparison of a single processes that is implemented in different chambers). In some embodiments, a single optical sensor may be included in the processing chamber. Other embodiments may include an array of optical sensors positioned around a perimeter of the processing chamber. Such embodiments may allow for chamber uniformity data (e.g., plasma uniformity, chamber surface uniformity, etc.) to be obtained. Furthermore, such embodiments may also provide an indication of chamber abnormality (e.g., chamber drift).

Referring now to FIG. 1, a cross-sectional illustration of a processing tool 100 is shown, in accordance with an embodiment. In an embodiment, the processing tool 100 comprises a chamber 105. For example, the chamber 105 may be suitable for low pressure processing operations. In one embodiment, the processing operations may include the generation of a plasma 107 in the chamber 105. In an embodiment, a substrate support 108 is in the chamber 105. The substrate support 108 may be a chuck (e.g., an electrostatic chuck, a vacuum chuck, or the like) or any other suitable support on which one or more substrates may be placed during processing.

In an embodiment, the processing tool 100 may comprise an in-situ optical sensor 120. The in-situ optical sensor 120 passes through a surface of the chamber 105 so that a first portion of the optical sensor 120 is inside the chamber 105 and a second portion of the optical sensor is outside the chamber 105. In an embodiment, the optical sensor 120 is illustrated as passing through a sidewall of the chamber 105. However, it is to be appreciated that the optical sensor 120 may be positioned through any surface of the chamber 105.

In the illustrated embodiment, a single optical sensor 120 is shown. However, it is to be appreciated that embodiments are not limited to such configurations, and more than one optical sensor 120 may be included in the processing tool 100. Furthermore, the optical sensor 120 only requires a single optical opening (i.e., a window) through the chamber 105. As will be described in greater detail below, the optical path includes a reflector 121 that reflects the electromagnetic radiation from a source 137 back through the same opening. This is in contrast to existing systems that require an optical path across the volume of the chamber 105 and requires at least two optical openings through the chamber.

In an embodiment, the optical sensor 120 comprises a housing. In an embodiment, the housing may comprise a first housing 124 and a second housing 122. In an embodiment, the first housing 124 may be fastened to the second housing 122 with any suitable fastener. In other embodiments, the housing may be a single structure. That is, the first housing 124 and the second housing 122 may be combined into a single structure. Furthermore, while a first housing 124 and a second housing 122 are disclosed, it is to be appreciated that the housing may comprise any number of components coupled together.

In an embodiment, the first housing 124 may extend through an opening in the chamber 105 and extend into the chamber interior volume. For example, an extension, such as a tube 126 may pass through the opening in the chamber 105. In an embodiment, the tube 126 may be an optically clear material. For example, the tube 126 may be quartz. However, it is to be appreciated that the tube 126 need not be optically clear. In some embodiments, the tube 126 may be a ceramic or metallic material. Furthermore, while a tube 126 is described, it is to be appreciated that any elongated member may extend into the volume of the chamber 105. Particularly, any structure that is capable of supporting a reflector 121 in the interior volume of the chamber 105 may be used.

In an embodiment, one or more openings 123 may be located along a length of the tube 126. The one or more openings 123 allow for the electromagnetic radiation from the plasma 107 to enter the optical sensor 120. Additionally, openings 123 expose the reflector 121 to the processing environment. Exposing the reflector 121 to the processing environment allows for the surface of the reflector 121 to be modified in substantially the same manner that interior surfaces of the chamber are modified during the processing operation. For example, the byproducts deposited onto interior surfaces of the chamber 105 may also be deposited onto the reflector 121. In a particular embodiment, the reflector 121 may comprise the same material as the interior surfaces of the chamber 105. Accordingly, changes to the surface of the reflector 121 may be assumed to substantially match changes to the interior surface of the chamber 105. In this manner, chamber surface monitoring may be implemented by the optical sensor 120.

In some embodiments, the reflector 121 may be a replaceable component. That is, the reflector 121 may be a removable component from the first housing 124. For example, the reflector 121 may be attached to a lid that covers the end of the tube 126. Having a removable reflector allows for the replacement of the reflector 121 after a useable lifespan.

Additionally, different reflector materials may be used to match the interior surface of the chamber for various processing tools.

In some embodiments, a lens 125 may secured between the first housing 124 and the second housing 122. The lens 125 is positioned along an optical path between the source 137 and the reflector 121 in order to focus electromagnetic radiation that passes along the optical path. In some embodiments, the lens 125 may be part of the seal that closes the opening through the chamber 105. For example, O-rings or the like may rest against a surface of the lens 125 facing towards the chamber 105.

In an embodiment, the optical sensor 120 may further comprise a source 137 and a sensor 138. The source 137 and the sensor 138 may be optically coupled to the optical path. For example, a fiber optic cable 132 may extend out from the second housing 122. In an embodiment, the fiber optic cable 132 may comprise a splitter 134 that branches off to a fiber optic cable 135 to the source 137 and a fiber optic cable 136 to the sensor 138.

In an embodiment, the source 137 may be any suitable source for propagating electromagnetic radiation along the optical path. Particularly, embodiments include a high precision source 137. A high precision source 137 provides a known electromagnetic spectrum that can be used as a reference baseline for making measurements with the optical sensor 120. In one embodiment, the source 137 may be a single wavelength source. For example, the source 137 may be a laser or a light emitting diode (LED). In other embodiments, the source 137 may be a broadband light source. For example, the source 137 may be an arc flash lamp (e.g., a xenon flash lamp).

In an embodiment, the sensor 138 may be any suitable sensor for detecting electromagnetic radiation. In an embodiment, the sensor 138 may comprise a spectrometer. For example, the spectrometer may have a charge-coupled device (CCD) array. In other embodiments, the sensor 138 may have a photodiode that is sensitive to a particular wavelength of electromagnetic radiation.

Figure 2:
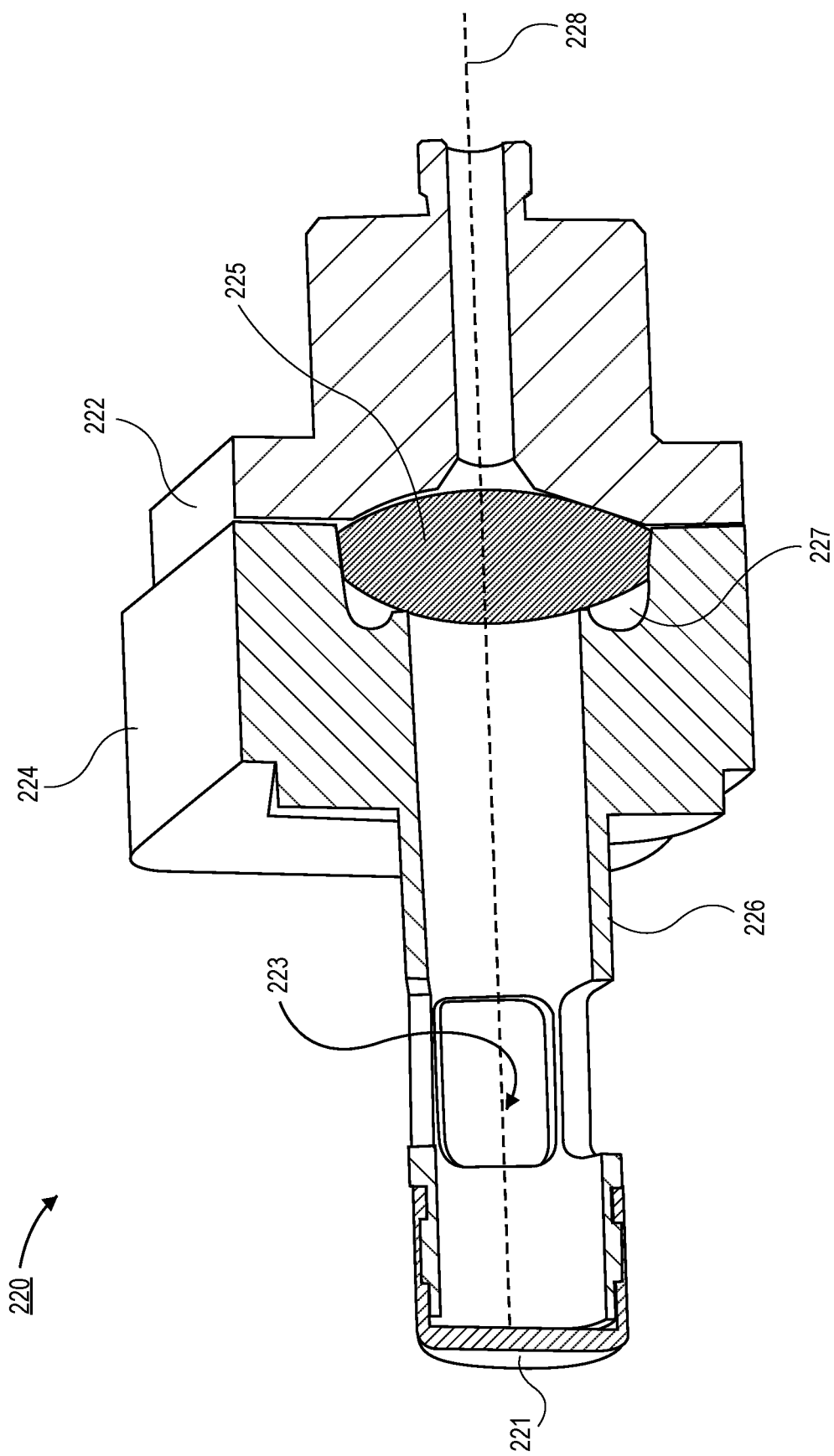
FIG. 2 is a cross-section of a perspective view of a sensor housing, in accordance with an embodiment.

Referring now to FIG. 2, a sectional view of a three-dimensional illustration of the housing of an optical sensor 220 is shown, in accordance with an embodiment. As shown, an optical path 228 extends through the housing. For example, the optical path 228 extends along a channel in the second housing 222, through the lens 225, and through the tube 226 of the first housing 224 towards the reflector 221. In an embodiment, openings 223 through the tube 226 allow for electromagnetic radiation from the processing environment (e.g., from the plasma) to pass into the housing and propagate along the optical path 228. The openings 223 also expose the reflector 221 to the processing environment inside the chamber. Accordingly, deposition or other conversion of the surface of the reflector 221 may be monitored in order to determine changes to the interior surfaces of the chamber.

As shown in FIG. 2, the reflector 221 is a cap that is attached over an end of the tube 226. Accordingly, the reflector 221 may be replaced by removing the cap and attaching a second cap with a second reflector 221. Additionally, FIG. 2 illustrates channels 227 proximate to the lens 225. In an embodiment, the channels 227 may be sized to receive an O-ring (not shown) that sits against the first housing 224 and the lens 225. Accordingly, a vacuum seal may be maintained even when there is an opening through the wall of the chamber.

As noted above with respect to FIG. 1, the housing of the optical sensor 220 may alternatively be comprised of a single component or more than two components (i.e., more than the first housing 224 and the second housing 222). Additionally, the tube 226 may be replaced with any elongated structure that can support a reflector along the optical path 228. For example, the tube 226 may be replaced with one or more beams that extend out from the first housing 224.

Figure 3A:
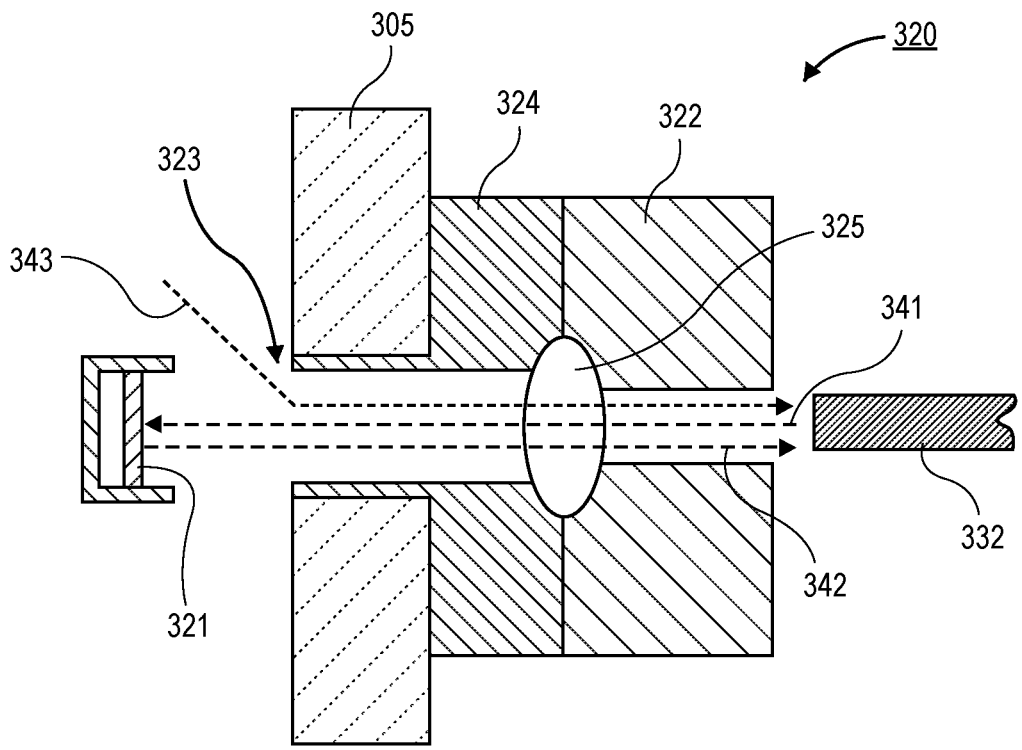
FIG. 3A is a cross-sectional illustration of an optical sensor passing through a chamber wall and illustrating the optical path through the sensor housing, in accordance with an embodiment.
Figure 3B:
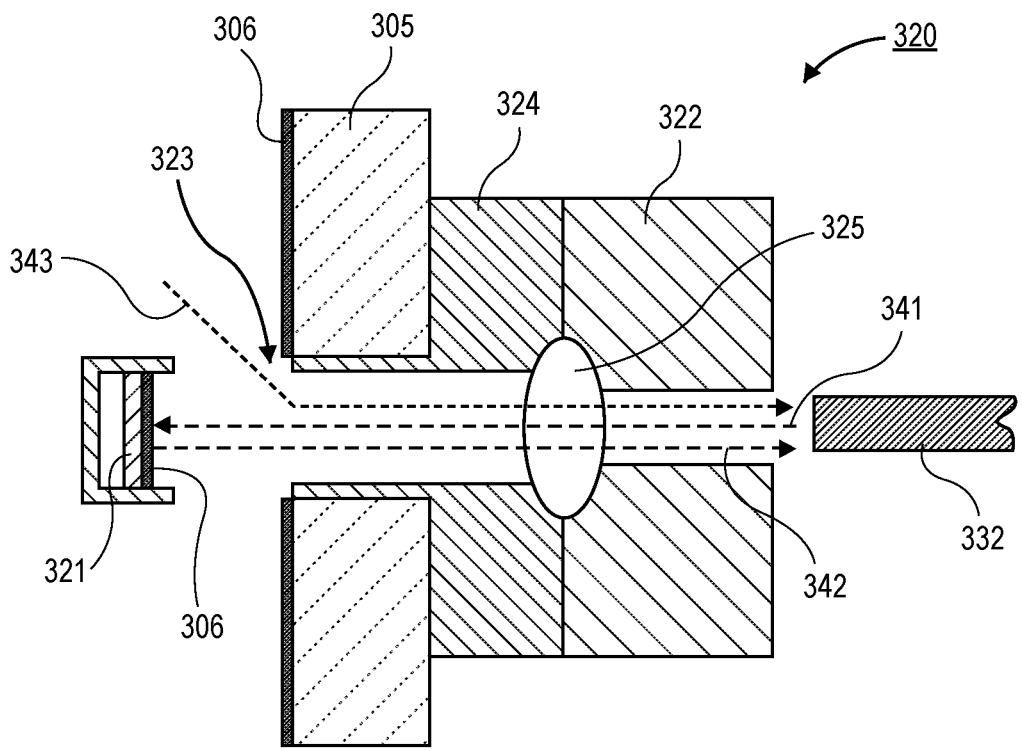
FIG. 3B is a cross-sectional illustration of the optical sensor after a layer of material is deposited over the reflector, in accordance with an embodiment.

Referring now to FIG. 3A and FIG. 3B, a pair of cross-sectional illustrations depict a process for using the optical sensor, in accordance with an embodiment.

Referring now to FIG. 3A, a cross-sectional illustration is shown at the start of processing of a substrate. As shown, the optical sensor 320 is substantially similar to the optical sensors 120 and 220 described above. For example, a housing comprising a first housing 324, a second housing 322, a lens 325, an a reflector 321 is shown. The reflector 321 is shown as floating in FIG. 3A. That is, only the openings 323 of the support structure are shown. However, it is to be appreciated that the reflector 321 is connected to the first housing 324 with structure out of plane of the cross-sectional illustration. For example, one or more beams or a tube may be used to connect the reflector 321 to the first housing 324.

In an embodiment, a reference signal 341 may be generated by the source (not shown) and optically coupled to the optical path through the housing 324, 322. For example, the reference signal 341 may propagate along a fiber optic cable 332 before entering the housing 322. The reference signal 341 may then propagate towards the reflector 321 and reflect back along the optical path as reflected signal 342. Reflected signal 342 may be optically coupled with the fiber optic cable 332 and be delivered to the sensor (not shown).

Since the source emits electromagnetic radiation with a known spectrum and intensity, a measurement of the reflected signal 342 by the sensor provides a baseline of the losses along the optical path. That is, the difference between the measurement of the reflected signal 342 (e.g., spectrum and intensity) to the known spectrum and intensity of the source provides a measure of the losses inherent to the optical sensor 320. Accordingly, the known losses may be used to calibrate subsequently obtained signals.

Particularly, electromagnetic radiation emitted by a plasma may be sensed by the sensor as well. For example, the plasma signal 343 may pass through an opening 323 of the optical sensor 320 and propagate along the optical path to the sensor (not show). The measurement of the plasma signal 343 may then be corrected by adding back in the known losses inherent to the optical sensor. As such, a quantitative measurement of the electromagnetic radiation emitted by the plasma may be provided.

Referring now to FIG. 3B, a cross-sectional illustration of the optical sensor 320 after a film 306 is disposed over surfaces of the chamber 305 and over the surface of the reflector 321 is shown, in accordance with an embodiment. In an embodiment, the film 306 may be a byproduct of a processing operation implemented in the chamber 305. For example, the film 306 may be a redeposition of byproducts of an etching process. In an embodiment where the surface of the reflector 321 is the same material as the interior surface of the chamber 305, the film 306 on the reflector 321 will be representative of the film 306 on the interior surface of the chamber 305.

Accordingly, the optical sensor 320 may also be used to determine one or more properties of the film 306. In an embodiment, the reflected signal 342 may be measured to find differences relative to the reference signal 341. For example, decreases in particular wavelengths of the reflected signal 342 (relative to the reference signal) may be used to determine what materials are deposited on the film. Particularly, certain materials will preferentially absorb portions of the spectrum of the reference signal 341. Accordingly, identifying the portions of the reflected signal 342 that are reduced in intensity allows for the composition of the film 306 to be determined. Additionally, changes to the reflected signal 342 may also identify film thicknesses.

Figure 4A:
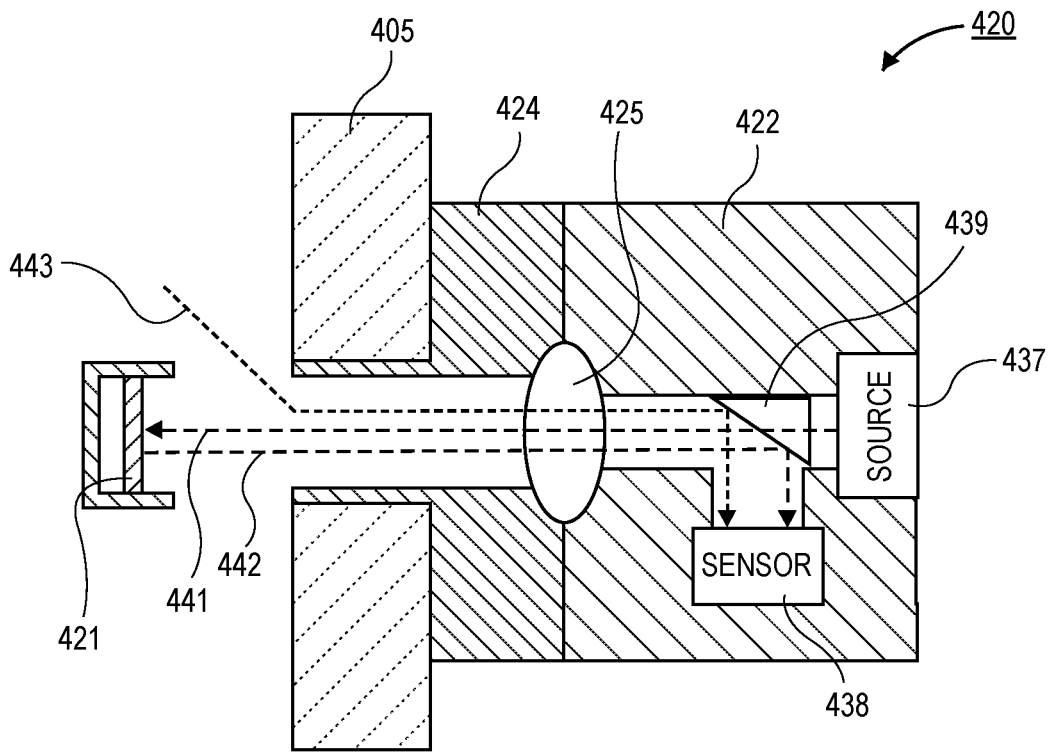
FIG. 4A is a cross-sectional illustration of an optical sensor with a source and a sensor integrated into the sensor housing, in accordance with an embodiment.

Referring now to FIG. 4A, a cross-sectional illustration of an optical sensor 420 through a surface of a chamber 405 is shown, in accordance with an additional embodiment. The optical sensor 420 in FIG. 4A is substantially similar to the optical sensor 320 in FIG. 3A, with the exception that the source 437 and the sensor 438 are integrated directly into the second housing 422. For example, the reference signal 441 may pass through the prism 439 and the lens 425 towards the reflector 421, and the reflected signal 442 and the plasma signal 443 may be redirected by the prism 439 towards the sensor 438. Accordingly optical coupling of the source 437 and the sensor 438 to the optical path may be implemented without fiber optic cables. Such embodiments may also provide a more compact optical sensor 420.

Figure 4B:
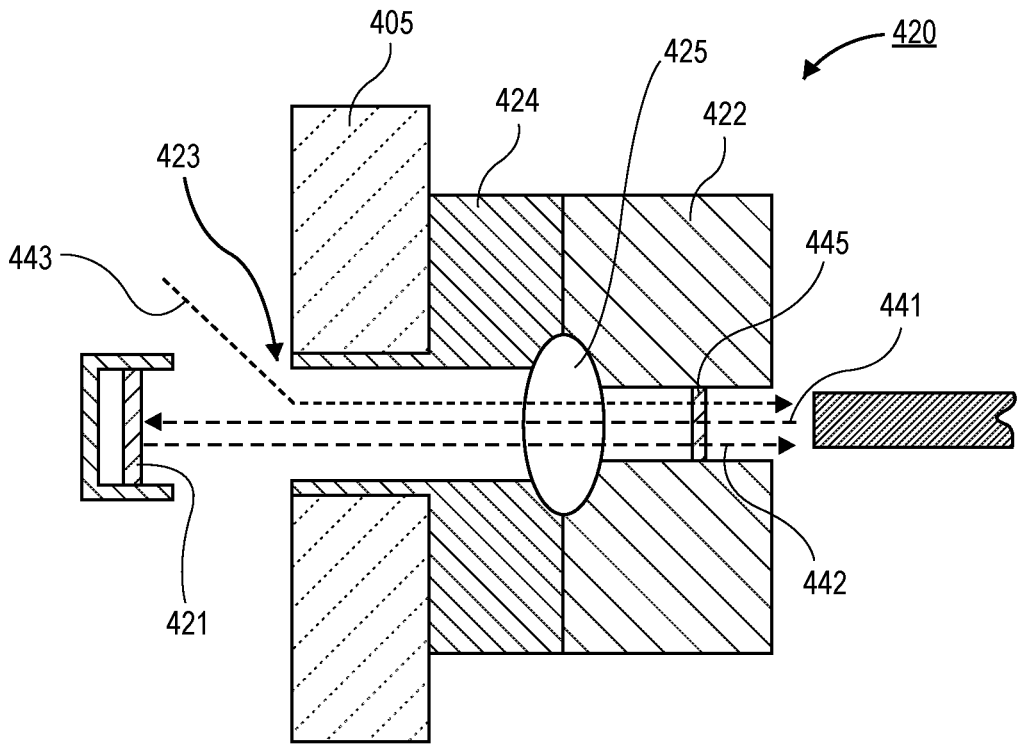
FIG. 4B is a cross-sectional illustration of an optical sensor with a filter along the optical path, in accordance with an embodiment.

Referring now to FIG. 4B, a cross-sectional illustration of an optical sensor 420 through a surface of a chamber 405 is shown, in accordance with an additional embodiment. The optical sensor 420 in FIG. 4B is substantially similar to the optical sensor 320 in FIG. 3A, with the exception that a filter 445 is positioned along the optical path. In an embodiment, the filter 445 may provide a specific pass band in order to improve signal to noise ratios, and improve performance of the optical sensor. In an embodiment, the filter 445 is positioned between the lens 425 and the sensor (not shown). That is the filter 445 is positioned outside of the chamber volume in order to be protected from the processing environment.

Figure 5:
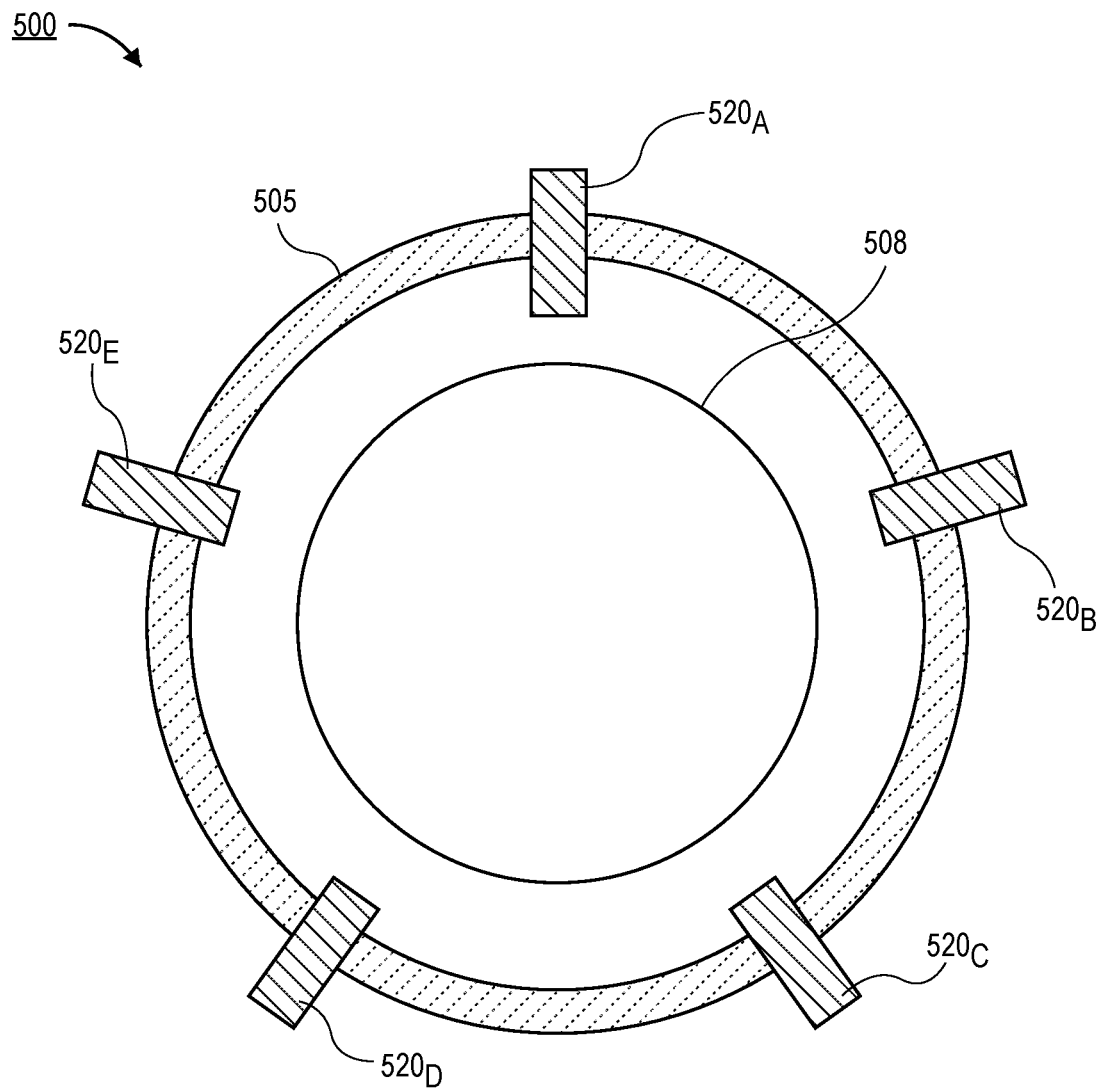
FIG. 5 is a plan view illustration of a processing chamber with an array of optical sensors passing through the chamber wall, in accordance with an embodiment.

Referring now to FIG. 5, a plan view cross-sectional illustration of a processing tool 500 is shown, in accordance with an embodiment. In an embodiment, the processing tool 500 may comprise a chamber 505. A substrate support 508 (e.g., a chuck or the like) may be located within the chamber 505. In an embodiment, a plurality of optical sensors $520_{A-E}$ are arranged in an array around the perimeter of the chamber 505. The optical sensors $520_{A-E}$ may be substantially similar to one or more of the optical sensors described above. In the illustrated embodiment five optical sensors $520_{A-E}$ are shown. However, it is to be appreciated that any number of optical sensors 520 may be included in the processing tool 500. The use of a plurality of optical sensors 520 allows for obtaining uniformity data. For example, plasma uniformity and/or wall condition uniformity may be obtained. Additionally, chamber drift may also be determined.

Figure 6A:
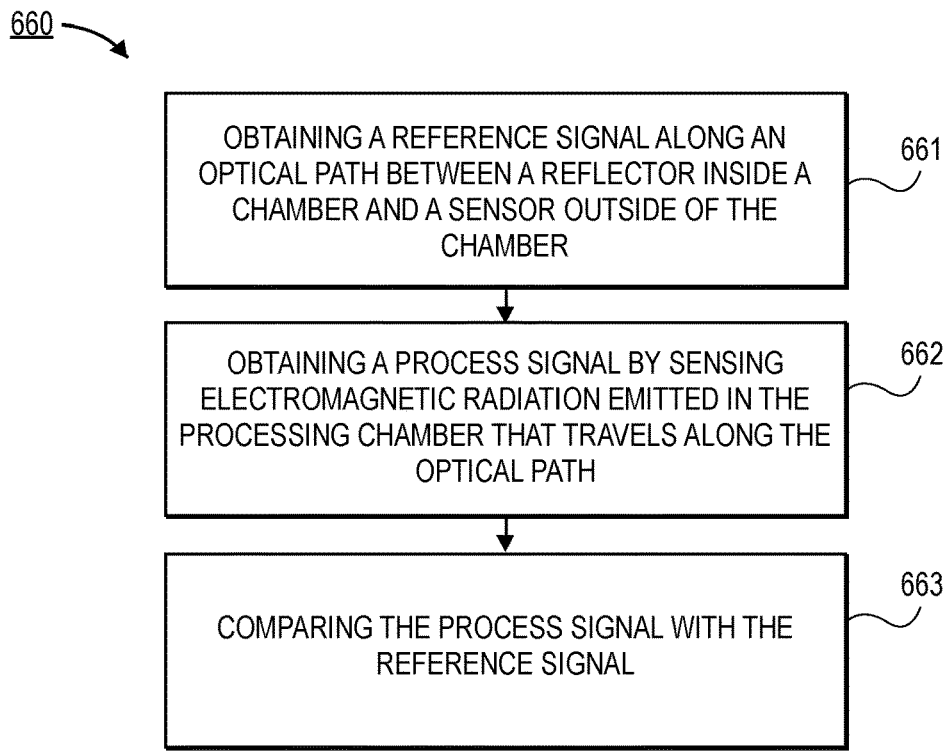
FIG. 6A is a process flow diagram that depicts a process for using an optical sensor to determine wall conditions or processing conditions, in accordance with an embodiment.
Figure 6B:
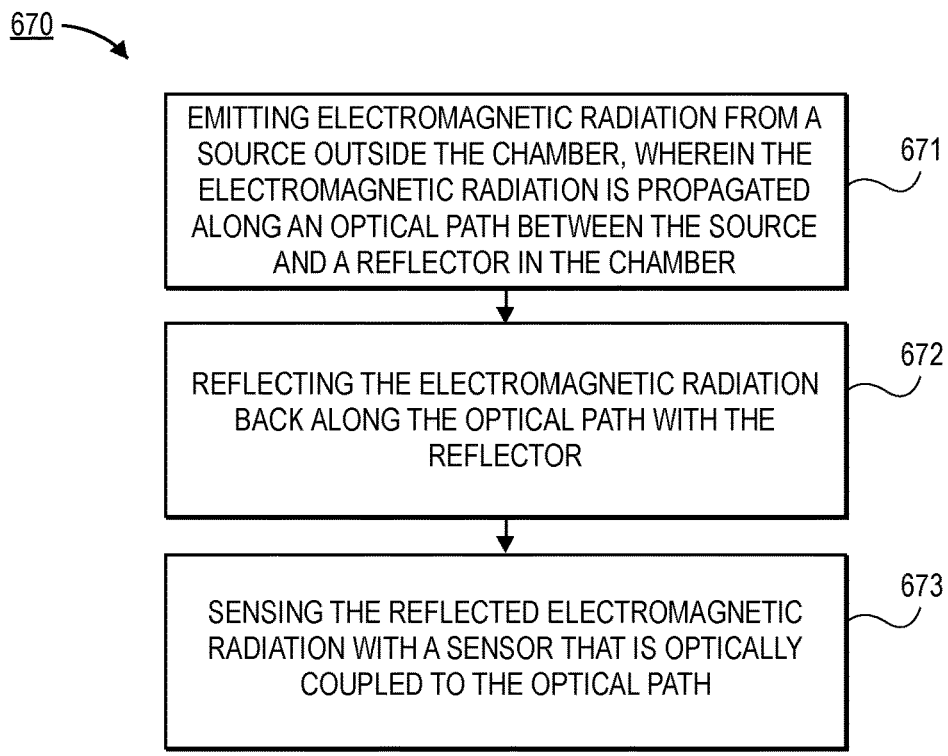
FIG. 6B is a process flow diagram that depicts a process for obtaining a reference signal in accordance with an embodiment.

Referring now to FIGS. 6A and 6B, process flow diagrams that depict processes for using an optical sensor to provide quantitative measurements in-situ are shown, in accordance with an embodiment.

Referring now to FIG. 6A, process 660 begins with operation 661 which includes obtaining a reference signal that is propagated along an optical path between a reflector inside a chamber and a sensor outside of the chamber. Particularly, operation 661 may comprise process 670 illustrated in FIG. 6B.

Referring now to FIG. 6B, process 670 may begin with operation 671, which includes emitting electromagnetic radiation from a source outside of the chamber. In an embodiment, the electromagnetic radiation is propagated along an optical path between the source and a reflector in the chamber. Process 670 may then continue with operation 672, which includes reflecting the electromagnetic radiation back along the optical path with the reflector. Process 670 may then continue with operation 673, which includes sensing the reflected electromagnetic radiation with a sensor that is optically coupled to the optical path.

Referring back to FIG. 6A, process 660 may then continue with operation 662, which comprises obtaining a process signal by sensing electromagnetic radiation emitted in the processing chamber that is propagated along the optical path. In an embodiment, process 660 may then continue with operation 663 which comprises comparing the process signal with the reference signal.

In an embodiment, the comparison of the reference signal with the process signal may provide a quantitative measurement of the process signal. Particularly, the reference signal may provide a measure of the losses inherent in the optical sensor. Accordingly, the losses inherent in the optical sensor may be added back into the process signal in order to provide a quantitative value for the process signal. Obtaining a quantitative value provides a more accurate picture of the processing conditions in the chamber. Furthermore, a quantitative value is comparable across different chambers. As such, chamber matching may be implemented in order to improve process uniformity across different chambers.

It is to be appreciated that the processing operations disclosed in FIGS. 6A and 6B need not be implemented in any particular order. That is, each of the signals may be obtained at any time. For example, in one embodiment, the reference signal may be obtained when no process is being implemented in the chamber. This provides a reference signal that is not altered by any electromagnetic radiation emitted by a plasma. However, it is to be appreciated that in some embodiments, the reference signal may be obtained when a plasma is struck in the chamber. In other embodiments, the process signal may be obtained when the source is off. In such embodiments, a pure signal from the plasma may be obtained without any interference from the source light. However, it is to be appreciated that in some embodiments, the source light may be on during the measurement of the process signal. Furthermore, it is to be appreciated that one or both of the reference signal and the process signal may be obtained during the processing of one or more substrates in the chamber. As such, measurements may be referred to as in-situ measurements.

Figure 7:
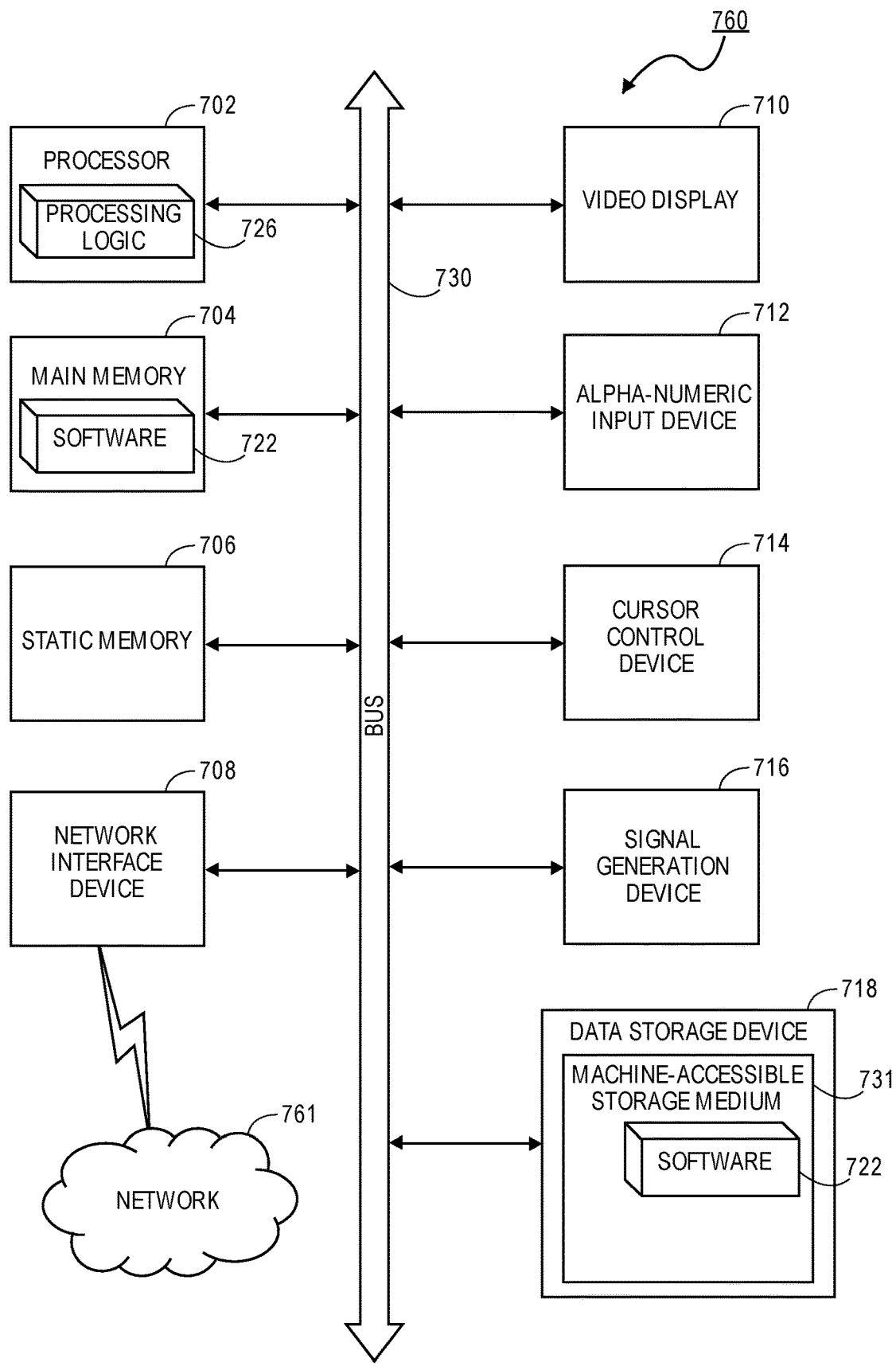
FIG. 7 illustrates a block diagram of an exemplary computer system that may be used in conjunction with an optical sensor with an optical path that passes through a chamber wall, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool, comprising:
    a chamber; and
    an optical sensor system that passes through a wall of the chamber, wherein the optical sensor system comprises:
    a housing;
    an optical path through the housing, wherein the optical path comprises a first end in the chamber and a second end outside of the chamber;
    a reflector at the first end of the optic al path;
    a lens between the reflector and the second end of the optical path; and
    an opening through the housing between the lens and the reflector, wherein the opening is within the chamber.

2. The optical sensor system of claim 1, further comprising:
    a light source optically coupled to the lens; and
    a sensor optically coupled to the lens.

3. The optical sensor system of claim 2, wherein the light source is a single wavelength source.

4. The optical sensor system of claim 2, wherein the light source is a broad band light source.

5. The optical sensor system of claim 2, wherein the light source and the sensor are optically coupled to the lens by a fiber optic cable.

6. The optical sensor system of claim 5, wherein the fiber optic cable comprises a splitter.

7. The optical sensor system of claim 2, further comprising:
    a band pass filter at a location along an optical path between the sensor and the opening.

8. The optical sensor system of claim 2, wherein the sensor is a spectrometer or a photodiode.

9. The optical sensor system of claim 2, wherein the light source and the sensor are integrated into the housing.

10. The optical sensor system of claim 1, wherein the housing is transparent.

11. The optical sensor system of claim 1, wherein the reflector is removable.

12. An optical sensing array for a plasma processing chamber, comprising:
    a plurality of optical sensing systems oriented around a perimeter of the processing chamber, wherein the optical sensing systems pass through a wall of the plasma processing chamber, wherein each of the plurality of optical sensing systems comprise:
    a housing that passes through the wall of the plasma processing chamber;
    an optical path through the housing, wherein the optical path comprises a first end and a second end;
    a reflector at the first end of the optical path;

a lens between the reflector and the second end of the optical path; and an opening through the housing within the plasma processing chamber, wherein the opening is between the lens and the reflector.

13. The optical sensing array of claim 12, wherein the plurality of optical sensing systems are configured to provide uniformity data of a plasma condition, a wall condition, or a plasma condition and a wall condition.

14. The optical sensing array of claim 12, wherein the plurality of optical sensing systems are configured to provide chamber drift monitoring.

* * * * *

UNITED STATES PATENT AND TRADEMARK OFFICE
CERTIFICATE OF CORRECTION

PATENT NO. : 11,735,401 B2
APPLICATION NO. : 17/466912
DATED : August 22, 2023
INVENTOR(S) : Lin et al.

It is certified that error appears in the above-identified patent and that said Letters Patent is hereby corrected as shown below:

In the Claims

In Claim 2, Column 10, Line 31, delete "optical sensor system" and insert -- processing tool --.

In Claim 3, Column 10, Line 35, delete "optical sensor system" and insert -- processing tool --.

In Claim 4, Column 10, Line 37, delete "optical sensor system" and insert -- processing tool --.

In Claim 5, Column 10, Line 39, delete "optical sensor system" and insert -- processing tool --.

In Claim 6, Column 10, Line 42, delete "optical sensor system" and insert -- processing tool --.

In Claim 7, Column 10, Line 44, delete "optical sensor system" and insert -- processing tool --.

In Claim 8, Column 10, Line 48, delete "optical sensor system" and insert -- processing tool --.

In Claim 9, Column 10, Line 50, delete "optical sensor system" and insert -- processing tool --.

In Claim 10, Column 10, Line 52, delete "optical sensor system" and insert -- processing tool --.

In Claim 11, Column 10, Line 54, delete "optical sensor system" and insert -- processing tool --.

Signed and Sealed this
Twenty-first Day of May, 2024

Katherine Kelly Vidal
*Director of the United States Patent and Trademark Office*